(12) United States Patent
Liu et al.

(10) Patent No.: US 8,431,080 B2
(45) Date of Patent: Apr. 30, 2013

(54) SOFT MEMS

(75) Inventors: Chang Liu, Winnetka, IL (US); Jonathan Engel, Minneapolis, MN (US); Kee Ryu, Portland, OR (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 966 days.

(21) Appl. No.: 11/809,757

(22) Filed: Jun. 1, 2007

(65) Prior Publication Data

US 2010/0072565 A1    Mar. 25, 2010

Related U.S. Application Data

(60) Provisional application No. 60/810,799, filed on Jun. 2, 2006.

(51) Int. Cl.
*B29C 67/24* (2006.01)

(52) U.S. Cl.
USPC ........ 422/82.02; 257/787; 257/417; 257/419; 422/502

(58) Field of Classification Search ............... 422/68.1, 422/100, 99, 104, 500, 501, 502, 503, 504, 422/505, 506, 507, 508, 82.02; 257/57, 417, 257/724, 411, 412, 413, 414, 415, 416
See application file for complete search history.

(56) References Cited

U.S. PATENT DOCUMENTS

| | | | |
|---|---|---|---|
| 4,611,171 A | 9/1986 | Woods | |
| 5,037,515 A | 8/1991 | Tsai et al. | |
| 5,239,870 A | 8/1993 | Kaneko | |
| 5,412,994 A | 5/1995 | Cook et al. | |
| 5,483,834 A | 1/1996 | Frick | |
| 5,726,480 A | 3/1998 | Pister | |
| 5,872,320 A | 2/1999 | Kamentser et al. | |
| 6,136,212 A | 10/2000 | Mastrangelo et al. | |
| 6,151,771 A | 11/2000 | Tzeng et al. | |
| 6,304,840 B1 | 10/2001 | Vance et al. | |
| 6,452,499 B1 | 9/2002 | Runge et al. | |
| 6,479,890 B1 | 11/2002 | Trieu et al. | |
| 6,631,638 B2 | 10/2003 | James et al. | |
| 6,825,539 B2 | 11/2004 | Tai et al. | |
| 7,030,411 B2 * | 4/2006 | Krulevitch et al. ............. 257/57 |

(Continued)

FOREIGN PATENT DOCUMENTS

| | | |
|---|---|---|
| WO | WO-02/095785 | 11/2002 |
| WO | WO-03/021679 | 3/2003 |

OTHER PUBLICATIONS

J. M. Engel, N. Chen, K. Ryu, S. Pandya, C. Tucker, Y. Yang, and C. Liu, "Multi-layer embedment of conductive and non-conductive PDMS for all-elastomer MEMS," Solid State Sensors, Actuators, and Microsystems Workshop, Hilton Head, SC, p. 316-319 (Jun. 4-8, 2006).

(Continued)

*Primary Examiner* — In Suk Bullock
*Assistant Examiner* — Sharon Pregler
(74) *Attorney, Agent, or Firm* — Greer, Burns & Crain Ltd.

(57) ABSTRACT

A microscale polymer-based apparatus comprises a substrate formed from a first polymer material and at least one active region integrated with the substrate. The at least one active region is patterned from a second polymer material that is modified to perform at least one function within the at least one active region.

25 Claims, 12 Drawing Sheets

U.S. PATENT DOCUMENTS

| | | | |
|---|---|---|---|
| 7,357,035 | B2 | 4/2008 | Liu et al. |
| 2002/0049080 | A1 | 4/2002 | Thompson |
| 2003/0080442 | A1* | 5/2003 | Unger .......................... 257/787 |
| 2004/0028875 | A1 | 2/2004 | Van Rijn et al. |
| 2004/0142477 | A1 | 7/2004 | Kumagai et al. |
| 2004/0248167 | A1 | 12/2004 | Quake et al. |
| 2005/0021247 | A1* | 1/2005 | Liu et al. .......................... 702/42 |
| 2006/0071286 | A1* | 4/2006 | Axelrod et al. ............... 257/414 |
| 2006/0113537 | A1 | 6/2006 | Krulevitch et al. |
| 2007/0234793 | A1 | 10/2007 | Liu |
| 2008/0022513 | A1 | 1/2008 | Liu |
| 2008/0022778 | A1 | 1/2008 | Liu |
| 2008/0072682 | A1 | 3/2008 | Liu |
| 2008/0089383 | A1 | 4/2008 | Liu |

OTHER PUBLICATIONS

D. Bullen, X. Wang, J. Zou, S. Hong, S. Chung, K.S. Ryu, Z. Fan, C.A. Mirkin, C. Liu, "Micromachined Arrayed Dip Pen Nanolithography (DPN) Probes for Sub-100 nm Direct Chemistry Patterning," Proceedings of 16th IEEE Int. Micor Electro Mechanical Systems Conf., MEMS 2003, Kyoto, Japan, Jan. 19-23, 2003.

J. Chen, S. Park, Z. Fan, G. Eden, C. Liu, "Development and Characterization of Micromachined Hollow Cathode Plasma Display Devices," IEEE Journal of Microelectromechanical Systems, vol. 11, No. 5, pp. 536-543, Oct. 2002.

K. Ryu, K. Shaikh, and C. Liu, "A Method to Monolithically Integrate Elastomer O-rings on Parylene Membranes for Improved Valve Sealing," presented at the Seventh International Conference on Miniaturized Chemical and Biochemical Analysis Systems (microTAS 2003), Squaw Valley, California U.S.A., 2003.

M. Khoo, C. Liu, "Micro Magnetic Silicone Elastomer Membrane Actuator," Sensors and Actuators, vol. 89, No. 3, pp. 259-266, Mar. 2001.

D. Armani, C. Liu, "Re-configurable Fluid Circuits by PDMS Elastomer Micromachining," 12th International Conference on MEMS, MEMS 99, pp. 222-227, Orlando, FL, 1998.

K. Ryu and C. Liu, "Precision Patterning of PDMS Thin Films: A New Fabrication Method and Its Applications," Sixth International Symposium on Micro Total Analysis System (mTAS), Nara, Japan Nov. 3-7, 2002.

Ayers, J., Zavracky, P.M., McGruener, N., Massa, D., Vorus, V., Mukherjee, R., Currie, S., 1998, "A Modular Behavioral-Based Architecture for Biomimetic Autonomous Underwater Robots," Proc. Autonomous Vehicles in Mine Countermeasures Symp., Naval Postgraduate School, CD ROM, http://www.cix.plym.ac.uk/cis/InsectRobotics/Biomimetics.htm.

Barnes, T.G., Truong, T.Q., Lu, X., McGruer, E., Adams, G.G., "Design, Analysis, Fabrication, and Testing of a MEMS Flow Sensor," 1999 ASME International Congress and Exposition on MEMS, vol. 1, 1999, pp. 355-361.

Beebe, D.J., Hsieh, A.S., Denton, D.D., and Radwin, R.G., "A Silicon force Sensor for Robotics and Medicine," Sensors and Actuators, A 50.

Boillat, M.A., van der Wiel, A.J., Hoogerwerf, A.C., de Rooij, N. F., 1995, "A Differential Pressure Liquid Flow Sensor for Flow Regulation and dosing Systems," Proc. IEEE Micro Electro Mechanical Systems, pp. 350-352.

Chen, J., Engel, J., Liu, C., "Development of Polymer-Based Artificial Haircell Using Surface Micromachining and 3D Assembly," 12th Intl. Conf. on Solid-State Sensors, Actuators and Microsystems, Boston, MA, 2003.

Chen, J., Fan, Z., Engel, J., Liu, C., "Towards Modular Integrated Sensors: the Development of Artificial Haircell Sensors Using Efficient Fabrication Methods," Proc. of the 2003 IEEE/RSJ Intl. Conf. on Intelligent Robots and Systems, Las Vegas, NV, Oct. 2003.

Chen, J., Fan, Z., Engel, J., Liu, C., "Two Dimensional Micromachined Flow Sensor Array for Fluid Mechanics Studies," ASCE Journal of Aerospace Engineering, vol. 16, pp. 85-97, 2003.

Chen, J., Liu, C., "Development and Characterization of Surface Micromachined, Out-of-Plane Hot-Wire Anemometer," Journal of Microelectromechanical Systems, vol. 12, No. 6, Dec. 2003.

Chen, J., Zou, J., Liu, C., "A Surface Micromachined, Out-of-Plane Anemometer," Proc of MEMS 02, Las Vegas, NV, 2002.

de Bree, H-H, Jansen, H.V., Lammerink, T.S.J., Krijnen, G.J.M, Elwenspoek, m., 1999, "Bi-Directional Fast Flow Sensor with a Large Dynamic Range," J. Micromech. Microeng. 9, 186-9.

Ebefors, T., Kalvesten, E., Stemme, G., 198, "Three Dimensional Silicon Triple-Hot-Wire Anemometer Based on Polyimide Joints," Proc. 11th Annual Int. Workshop on Micro Electro Mechanical Systems: An Investigation of Micro Structures, Sensor, Actuators, Machines and Systems, pp. 93-8.

Editor, Touchy Touchy, The Economist, pp. 66-67, 2002.

Engel, J.M., Chen, J., Bullen, D. & Liu, C., "Polyurethane Rubber as a MEMS Material: Characterization and Demonstration of an All-Polymer Two-Axis Artificial Haircell Flow Sensor," presented at IEEE International Conference on MEMS, 2005.

Engel, J.M., Chen, J., Chen, N., Pandya, S. & Liu, C., "Multi-walled Carbon Nanotube Filled Conductive Elastomers: Materials and Application to Micro Transducers," presented at IEEE International Conference on MEMS, 2006.

Engel, J., Chen, J., Liu, C, "Development of a Multi-Modal, Flexible Tactile Sensing Skin Using Polymer Micromachining," 12th Intl. Conf. on Solid-State Sensors, Actuators and Microsystems, Boston, MA, 2003.

Enoksson, P., Stemme, G., Stemme, E., 1996, "A Coriolis Mass Flow Sensor Structure in Silicon," Proc. 9th Annual Int. Workshop on Micro Electro Mechanical Systems: An Investigation of Micro Structures, Sensors, Actuators, Machines and Systems, pp. 156-161.

Fan, Z., Chen, J., Zou, J., Bullen, D., Liu, C., and Delcomyn, F., "Design and Fabrication of Artificial Lateral Line Flow Sensors," Journal of Micromechanics and Microengineering, 12 (Sep. 2002), pp. 655-661.

Gray, B.L., Fearing, R.S., "A Surface Micromachined Microtactile Sensor Array," Proc 1996 IEEE Int'l Conf. on Robotics and Automation, pp. 1-6.

William H. Grover, AMM.S., Chung N. Liu, Eric T. Lagally and Richard A. Mathies (2003), "Monolithic Membrane Valves and Diaphragm Pumps for Practical Large-Scale Integration into Glass Microfluidic Devices," Sensors and Actuators B: Chemical 89(3): 315-323.

C.M. Ho, "Fluidics—The Link Between Micro and Nano Sciences and Technologies," Proc. 14th IEEE Int. Conf. MEMS, Interlaken, Switzerland, p. 375, 2001.

Jiang, F., Tai, Y.C., Ho, C.M., Rainer, K., and Garstenauer, M., 1994, Theoretical and Experimental Studies of Micromachined Hot-Wire Anemometer, Digest IEEE Int. Electron Devices Meetings (IEDM) (San Francisco), pp. 139-142.

Jiang, F., Tai, Y.C., Walsh, K., Tsao, T., Lee, G.B., Ho, C.M., "A Flexible MEMS Technology and its First Application to Shear Stress Sensor Skin," Proc 1997 IEEE Int'l Conf. on MEMS, pp. 465-470.

M. Jones, D. Alland, M. Marras, H. El-Hajj, M. E. Taylor, and W. McMillan. "Rapid and Sensitive Detection of Mycobacterium DNA using Cepheid SmartCycler and Tube Lysis System," Clin. Chem. 47(10): 1917-1918, 2001. http://www.cepheid.com.

Jorgensen, A. M., et al., "A Biochemical Microdevice with an Integrated Chemiluminescence Detector," Sensors and Actuators B: Chemical, 2003, 90(1-3): p. 15-21.

Jung, Y.J., Kar, S., Talapatra, S., Soldano, C., Viswanathan, G., Li, X., Yao, Z., Ou, F.S., Avadhanula, A., Vajtai, R., Curran, S., Nalamasu, O. & Ajayan, P.M., "Aligned Carbon Nanotube-Polymer Hybrid Architectures for Diverse Flexible Electronic Applications," Nano Letters, vol. 6, pp. 413-418, 2006.

Kalvesten E., Vieider C., Lofdahl, L., Stemme, G., 1996, "An Integrated Pressure-Flow Sensor for Correlation Measurements in Turbulent Gas Flows," Sensors Actuators A 52, 51-8.

Kane, B.J., Cutkosky, M.R., Kovacs, T.A., "A Traction Stress Sensor Array for Use in High-Resolution Robotic Tactile Imaging," Journal of MEMS, vol. 9, pp. 425-434, 2000.

Kolesar, E.S., Dyson, C.S., "Object Imaging with a Piezoelectric Robotic Tactile Sensor," Journal of MEMS, vol. 4, pp. 87-96, 1995.

Lee, H.K., Chang, S.I., Kim, K.H., Kim, S.J., Yun, K.S. & Yoon, E., "A modular expandable tactile sensor using flexible polymer," presented at IEEE International Conference on MEMS, 2005.

Lee, M.H., Nicholls, H.R., "Tactile Sensing for Mechatronics—a State of the Art Survey," Mechatronics, vol. 9, pp. 1-33, 1999.

Leineweber, M., Pelz, G., Schmidt, M., Kappert, H., Zimmer, G., "New Tactile Sensor Chip with Silicone Rubber Cover," Sensors and Actuators A, vol. 84, 2000.

Liu et al., "Polymer Micromachining and Applications in Sensors, Microfluidics, and Nanotechnology," 226$^{th}$ American Chemical Society National Meeting, New York, 2002.

Li, J., Fan, J., Chen, J., Zou, J, Liu, C., Delcomyn, F., "High Yield Microfabrication Process for Biomimetic Artificial Haircell Sensors," smart Electronics, MEMS, and Nanotechnology, Conference (Conference 4700), SPIE's 9$^{th}$ annual International Symposium on Smart Structures and Materials, Mar. 17-21, 2002, San Diego, CA.

Liu, C., Huang, J., Zhu, Z., Jiang, F., Tung, S., Tai, Y.C., Ho, C.M., "A Micromachined Flow Shear-Stress Sensor Based on Thermal Transfer Principles," IEEE/ASME Journal of Microelectromechanical Systems (JMEMS), vol. 8, pp. 90-99, 1999.

Lofdahl, L., Kalvesten, E., Hadzianagnostakis, T., Stemme, G., 1996, "An Integrated Silicon Based Wall Pressure-Shear Stress Sensor for Measurements in Turbulent Flows," Proc. 1996 Int. Mechanical Engineering Congress and Exposition, New York, NY, pp. 245-251.

Lofdahl, L., Stemme, E., Stemme, G., 2001, "Silicon Based Flow Sensors Used for Mean Velocity and Turbulence Measurements," Exp. Fluids, 12, 270-6.

Martin, R., "Mother Knows Best: Imitating Nature is the Sincerest Form of Flattery," Forbes ASAP, pp. 26-29, 2002.

Ozaki, Y., Ohyama, T., Yasuda, T., Shimoyama, I., 2000, "An Air Flow Sensor Modeled on Wind Receptor Hairs of Insects," Proc. MEMS '00, Miyazaki, Japan, pp. 531-536, Miyazaki, Japan.

Padmanabhan, A., Goldberg, H., Breuer, K.D., Schmidt, M.A., 1996, "A Wafer-Bonded Floating-Element Shear Stress Microsensor with Optical Position Sensing by Photodiodes," J. Microelectromech. Syst., 5, 307-315.

Petersen, "Silicon as a Mechanical Material," Proc of the IEEE, vol. 70, pp. 420-457, 1982.

Pfann, W.G., Thurston, R.N., 1961, "Semiconducting Stress Transducers Utilizing the Transverse and Shear Piezoresistance Effects," J. Appl., Phys. 32, 2008-9.

Reston, R.R., Kolesar, E.S., "Robotic Tactile Sensor Array Fabricated from a Piezoelectric Polyvinylidene Fluoride Film," Proc 1990 IEEE NAECON 3.

Richter, M., Wackerle, M., Woias, P., and Hillerich, B., 1999, "A Novel Flow Sensor with High Time Resolution Based on Differential Pressure Principle," Proc., 12 Int. Conf. on Micro Electro Mechanical Systems (Orlando, FL), pp. 118-123.

Ryu, K., Wang, X., Shaikh, K. & Liu, C., "A method for precision patterning of silicone elastomer and its applications," Journal of Microelectromechanical Systems, vol. 13, pp. 568-575, 2004.

Shida, K., Yuji, J.I., "Discrimination of Material Property by Pressure-Conductive Rubber Sheet Sensor with Multi-Sensing Function," Proc 1996 IEEE Int'l Symp. on Industrial Electronics, vol. 1, pp. 54-59.

Shimizu, T., Shikida, M., Sato, K., Itoigawa, K., "A New Type of Tactile Sensor Detecting Contact Force and Hardness of an Object," Proc 2002 IEEE Int'l Conf. on MEMS, pp. 344-347.

Su et al., "Characterization of a highly Sensitive Ultra-Thin Piezoresistive Silicon, Cantilever Probe and its Application in Gas Flow Velocity Sensing," Journal of Micromechanics and Microengineering, vol. 12, 2002, pp. 780-785.

Sugiyama, S., Kawahata, K., Yneda, M., Igarashi, I, "Tactile Image Detection Using a 1K-Element Silicon Pressure Sensor Array," Sensors and Actuators A, vol. 22, 1989.

Svedin, N., Kalvesten, E., Stemme, E., Stemme, G., 1998, "A New Silicon Gas-flow Sensor Based on Lift Force," J. Microelectromech. Syst., 7, 303-8.

Svedin, N., Stemme, E., Stemme G., 2001, "A Static Turbine Flow Meter with a Micromachined Silicon Torque Sensor," Technical Digest MEMS 2001: 14$^{th}$ IEEE Int. Conf. on Micro Electro Mechanical Systems (Interlaken, Switzerland), pp. 208-211.

Thaysen et al., "Polymer-based Stress Sensor with Integrated Readout," Journal of Physics D—Applied Physics, vol. 35, No. 21, Nov. 2002, pp. 2698-2703.

van Baar, J.J., Wiegerink, R.J., Iammerink, T.S.J., Krijnen, G.J.M., Elwenspoek, M., 2001, "Micromachined Structures for Thermal Measurements of Fluid and Flow Parameters," J. Micromech. Micoeng., 11, 311-318.

van der Wiel, A.J., Linder, C., Rooij de, N. F., Bezinge, A., 1993, "A Liquid Velocity Sensor Based on the Hot-Wire Principle," Sensors Actuators, A A37-A38, 693.

van Honschoten, J.W., Krijnen, G.J.M., Svetovoy, V.B., de Bree, H-E, Elwenspoek, M.C., 2001, "Optimization of a Two Wire Thermal Sensor for Flow and Sound Measurements," Proc. 14$^{th}$ Int. Conf. Micro Electro Mechanical Systems (MEMS'2001), pp. 523-526.

Wang, X., Engel, J., Chen, J., Liu, C., "Liquid Crystal Polymer Based MEMS Applications," Journal of Micromechanics and Microengineering, vol. 13, May 2003, pp. 628-633.

Xu, Y., Jiang, F., Lin, Q., Clendenen, J., Tung, S., and Tai, Y.C., 2002, "Under Water Shear Stress Sensor," MEMS '02: 15$^{th}$ IEEE Int. Conf. on Micro Electro Mechanical Systems, Las Vegas, NV, Jan. 20-24.

Zou, Jun Chen, L., Liu, C., Schutte-aine, J., "Plastic Deformation Magnetic Assembly (PDMA) of Out-of-Plane Microstructures: Technology and Application," Journal of Microelectromechanical Systems, 10 (2), pp. 302-309, Jun. 2001.

D. Armani, C. Liu, "*Microfabrication Technology for Plycaprolactorn, a Biodegradable Polymer*," Journal of Micromechanics and Microengineering, vol. 10, pp. 80-84, 2000.

* cited by examiner

SOFT MEMS

PRIORITY CLAIM

This application claims the benefit of U.S. Provisional Application Ser. No. 60/810,799, filed Jun. 2, 2006, under 35 U.S.C. §119.

STATEMENT OF GOVERNMENT INTEREST

This invention was made with Government assistance under Defense Advanced Research Projects Agency (DARPA) Grant No. FA9550-05-1-0459. The Government has certain rights in this invention.

FIELD OF THE INVENTION

The invention relates generally to the field of microscale devices.

BACKGROUND OF THE INVENTION

It is known to incorporate polymer materials, such as elastomers, into microscale devices for structural purposes, while relying on non-polymer materials, such as metals, in such devices for performing active device functions. In some applications, however, use of metal components introduces problems, for example, due to a lack of robustness or conformity of the devices used.

SUMMARY OF THE INVENTION

According to example embodiments of the invention, a microscale polymer-based apparatus is provided. The apparatus comprises an insulating substrate formed from a first polymer material and at least one active region embedded in the substrate. The at least one active region is patterned from a second polymer material that is modified to be conductive and perform at least one function within the at least one active region.

According to other embodiments of the invention, a method of forming a microscale polymer-based device is provided. In an example method, a photoresist is patterned on a substrate to provide a photoresist mold. A modified polymer is applied to the photoresist mold to form at least one modified polymer structure. The patterned photoresist is removed, and nonmodified polymer is formed around the at least one modified polymer structure to provide a nonmodified polymer structure and capture the at least one modified polymer structure within the nonmodified polymer structure. The at least one modified polymer structure and the nonmodified polymer structure are released from the substrate.

DETAILED DESCRIPTION

Figure 1:
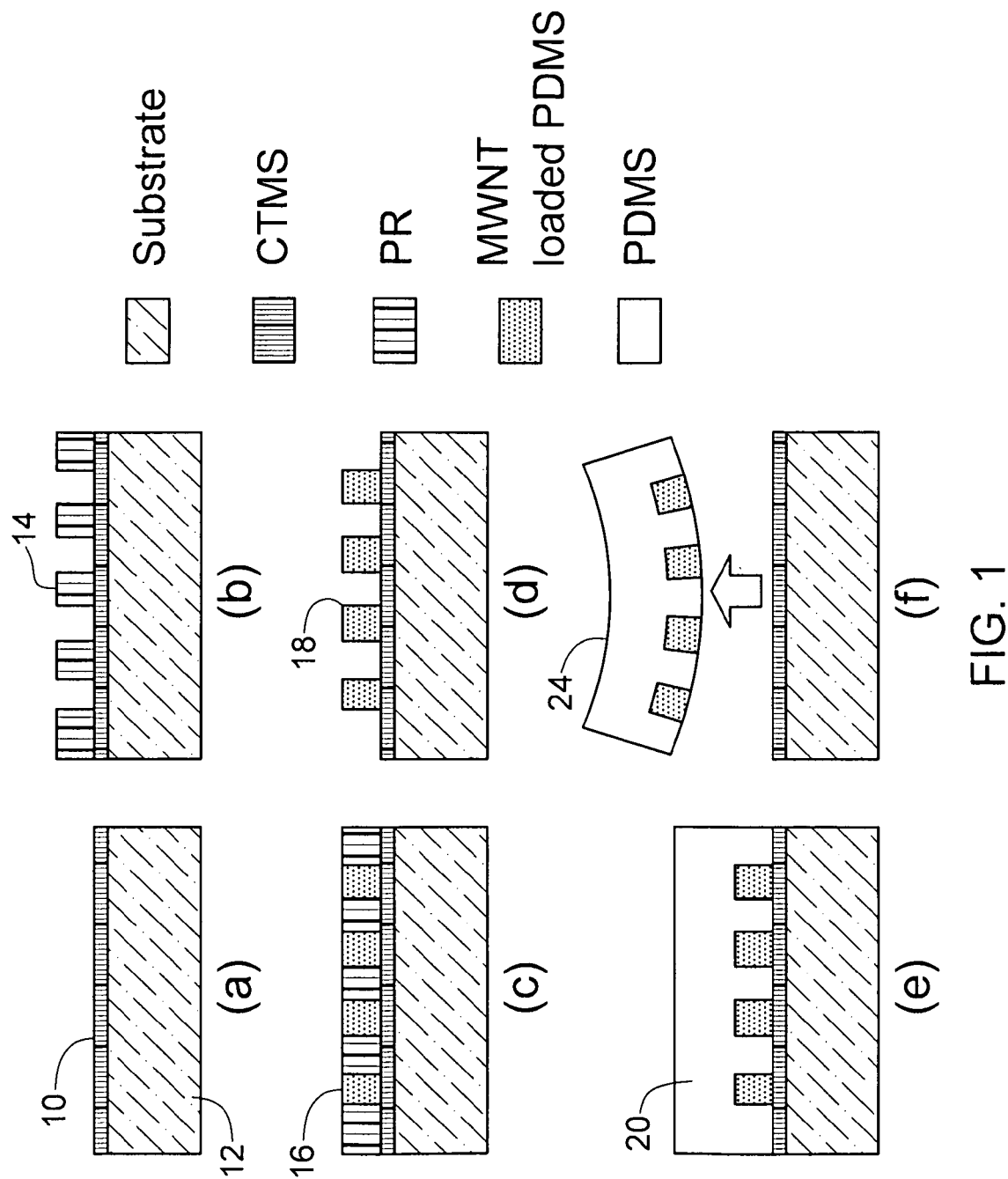
FIGS. 1A-1F show steps in an example process for fabricating a single layer of a device integrating modified and non-modified polymers, according to an embodiment of the present invention.

It is desirable to create devices that can be handled directly, take advantage of the unique characteristics of composite elastomers, and allow applications that require conformal and robust materials. Preferred embodiments of the present invention provide preferably all-polymer devices with embedded sensors or other active components. Such devices provide improved robustness, and reduce or eliminate the need for silicon or metal parts in particular sensors.

Generally, a preferred structure includes a monolithic integration of at least two polymer-based materials, differing in at least one property. The two types of polymer materials may be, for example, a modified polymer (e.g., a polymer composite) and the same polymer without modification. In an exemplary embodiment, a polymer is mixed or otherwise combined or treated with another material to provide the modified polymer (e.g., polymer composite) with new properties, and thus making the modified polymer functional. Such properties, as nonlimiting examples, may make the polymer conductive or sensing (e.g., signal producing). Exemplary, nonlimiting materials that may be mixed with a polymer to provide additional properties include metal powder (e.g., nickel) for increasing conductivity, multi-walled carbon nanotubes (MWNT) for conductivity, carbon black, aluminum nitrate for thermal sensitivity, silicon dioxide to make the polymer porous, molecules that combine to induce swelling or electrical charge, a biological agent, an enzyme, chemical markers, and others.

In a preferred method for forming a structure, a polymer is combined (e.g., mixed) with one or more materials to provide new properties for a modified polymer, and one or more different regions of the modified polymer are integrated with, e.g., formed, in or on the other (e.g., non-modified) polymer to provide active regions. For example, the polymer composite may be micropatterned. Generally, a region including the polymer having the additional property (such as the modified polymer) is encapsulated or separated by the other, non-modified or nonfunctional, polymer.

An exemplary method for forming regions in a single layer fabrication process includes patterning a photoresist mold on a substrate, applying the composite or modified polymer to the mold, removing excess composite or modified polymer, removing the mold to leave patterned modified polymer behind, spin casting the unmodified polymer, and peeling off the structure from the substrate. However, other elastomer patterning techniques may be used, such as techniques for defining microfluidic or pneumatic channels. Further, multiple layers may be combined to create more complex devices.

Electrical connections between the formed active regions may be provided by, for example, forming conductive paths using the modified (e.g., composite) material between the active regions and outside devices. Alternatively, liquid metals may be applied to the device, such as but not limited to Gallium, Indium, tin, mercury, etc. to improve localization of the active regions.

It will be appreciated by one of ordinary skill in the art that various types of structures may be formed according to embodiments of the present invention, and that the specific structures, polymer modifications, polymers, patterns, etc., described in examples herein are not intended to limit the scope of the present invention to such examples. Forming active regions may, as nonlimiting examples, include forming a series of freestanding and/or embedded wires on or in a substrate, gaskets, valves, heaters, sensors, or any of various layers and/or structures. The modified polymer may be used in an integrated polymer-based structure to provide any of various applications, including, but not limited to, capacitive plates, tactile sensors, strain gauges, etc.

Such integration, for example, can result in strips or other patterned pieces of polymer that are functionalized or active. For example, clear polymer sheets may be provided having strips, functioning like metal, but made of polymers. The particular modifications, including the material(s) to be used, the ratio for combining or treating, etc., and the pattern or region formed from the modified polymer with respect to the non-modified polymer may vary depending on the desired application.

Particular example devices according to the present invention use modified and unmodified PDMS (polydimethylsiloxane) elastomer. PDMS is widely used in MEMS. However, PDMS is non-conductive, and as a result elastomers such as PDMS have played a large but mainly structural role in MEMS, serving as protective layers, encapsulants, valve diaphragms, fluidic channel structures, etc.

A number of "active" devices have been made using modified elastomers, including organic vapor sensors, liquid sensors, force sensitive resistors, and ultrasonic emitters. Such devices use elastomers mixed with solid fillers, such as carbon black, MWNT, or metallic powders to give the resulting composite material desired properties. Researchers have also captured metal films in PDMS layers to create elastomer tactile sensors. More recently, work has been done to capture in-situ grown MWNT in PDMS to create strain gauges and field emission devices.

According to embodiments of the present invention, wholly polymer-based devices with embedded elastomer wires, electrodes, heaters, sensors, etc. can be realized by monolithic integration of modified (e.g., conductive) and unmodified (e.g., non-conductive) PDMS. Using such integration, elastomer strain gauges, capacitive pressure sensors, microfluidic channels with integrated heaters and sensors, and various other devices are possible, providing MEMS capabilities in soft devices. An example device fabrication process according to embodiments of the present invention uses a series of PDMS patterning, micromolding, and bonding techniques with conductive PDMS features made by mixing with multiwall carbon nanotubes (MWNT).

Exemplary embodiments of the present invention provide devices that can be handled directly, take advantage of the unique characteristics of composite elastomers, and allow applications that require conformal and robust materials. By combining spin casting and molding, one can provide a number of all-elastomer devices with embedded conductors and sensors.

In example devices, conductive PDMS is incorporated within structural insulating PDMS substrates to realize devices having functional regions of conductive PDMS. An exemplary fabrication process is provided for such incorporation according to embodiments of the present invention. Referring now to the drawings, the example process begins with the vapor coating of chlorotrimethylsiloxane (CTMS) 10 on a substrate 12 to assist in the release of the final elastomer assembly (FIG. 1A). Next, photoresist (PR) 14 is spun and patterned to define the molds for the conductive PDMS (FIG. 1B).

PDMS is then mixed with multiwalled carbon nanotubes (MWNT) to make a conductive composite. The ratio of MWNT to PDMS elastomer is chosen depending on the desired application and performance of the device. In example devices having simple conductors for capacitive sensors or resistive heaters, a large amount of MWNT may be added to increase the conductivity of the composite. In the case of strain or force sensitive devices, a lower loading of MWNT may be desired to increase sensitivity. Details on the conductivity of PDMS and MWNT composites can be found in J. M. Engel, J. Chen, N. Chen, S. Pandya, and C. Liu, "Multi-Walled Carbon Nanotube Filled Conductive Elastomers: Materials and Application in Micro Transducers", IEEE International Conference on MEMS, 2006. In an exemplary device, 10% by weight MWNT is mixed with Sylgard-184 PDMS to form the conductive PDMS.

Once the MWNT and PDMS have been mixed, the conductive PDMS 16 is applied to the PR mold and patterned (FIG. 1C) to form one or more conductive PDMS structures 18. An example patterning method is described in K. Ryu, X. Wang, K. Shaikh, and C. Liu, "A method for precision patterning of silicon elastomer and its applications", Journal of Microelectromechanical Systems, vol. 13, pp. 568-575, 2004. Excess conductive PDMS 16 after application may be removed, for example, using a blade. The patterned elastomer is cured at 90° C. for 10 minutes, and the PR mold 14 is removed, for example in acetone (FIG. 1D). The conductive PDMS structures 18 are then captured by either spin or pour casting unmodified PDMS 20 around them (FIG. 1E). The resulting assembly 24 is cured at 90° C. for 30 minutes in a leveled oven before being removed, for example, peeled, from the substrate (FIG. 1F).

This exemplary process can be combined with other traditional elastomer patterning techniques such as those used for defining microfluidic or pneumatic channels. Multiple layers can also be combined to create complex devices such as, but not limited to, capacitive pressure sensors.

Figure 2:
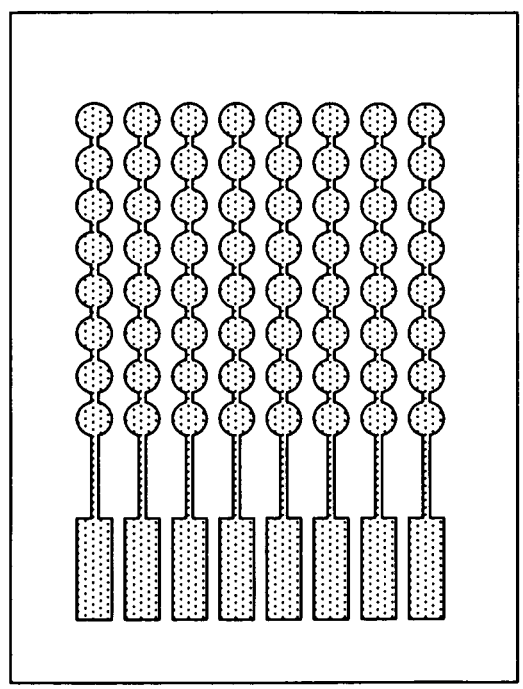
FIG. 2 is a photograph of a polydimethylsiloxane (PDMS) tactile sensor sheet, according to an embodiment of the present invention.

For example, FIG. 2 shows a PDMS tactile sensor sheet. The sensor sheet includes an array of electrodes (shown in black) made of conductive PDMS and embedded in transparent, nonconductive PDMS skin. It will be appreciated that the number, specific pattern, etc. of the individual electrodes can be varied. The device provides, for example, a soft capacitive tactile sensor sheet.

Figure 3:
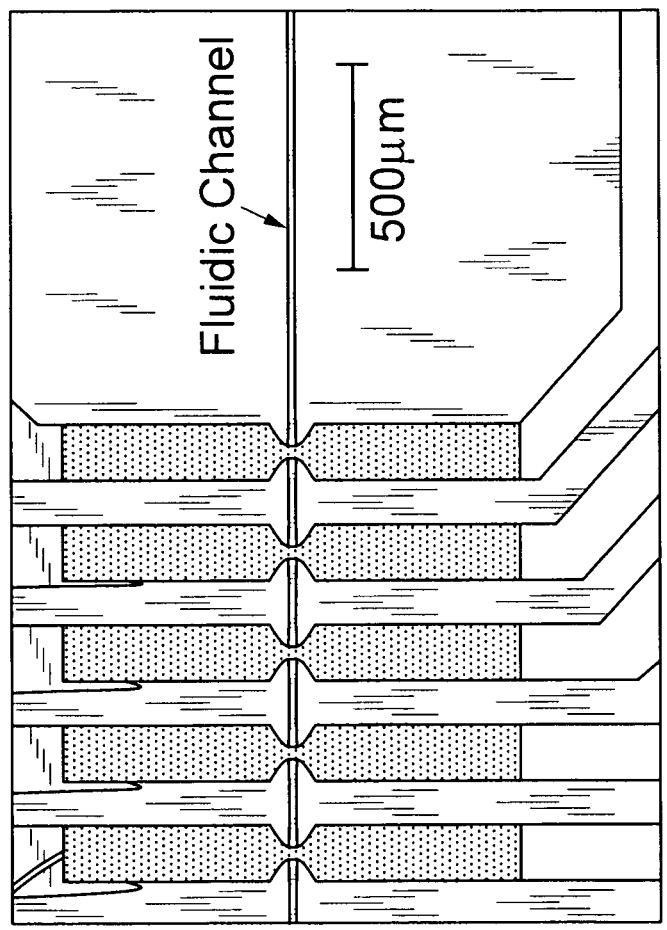
FIG. 3 is a micrograph of a PDMS microfluidic channel with embedded conductive elastomer devices crossing the channel, according to an embodiment of the present invention.

FIG. 3 shows another device including conductive and nonconductive PDMS. Within a nonconductive PDMS sensor skin, a microfluidic channel is formed extending along the length of the device. An array of embedded conductive elastomer devices cross the microfluidic channel so that the microfluidic channel substantially bisects the embedded conductive elastomer devices. These conductive elastomer devices may include, for example, heaters, conductors, sensors (e.g., flow rate sensors), etc.

Figure 4:
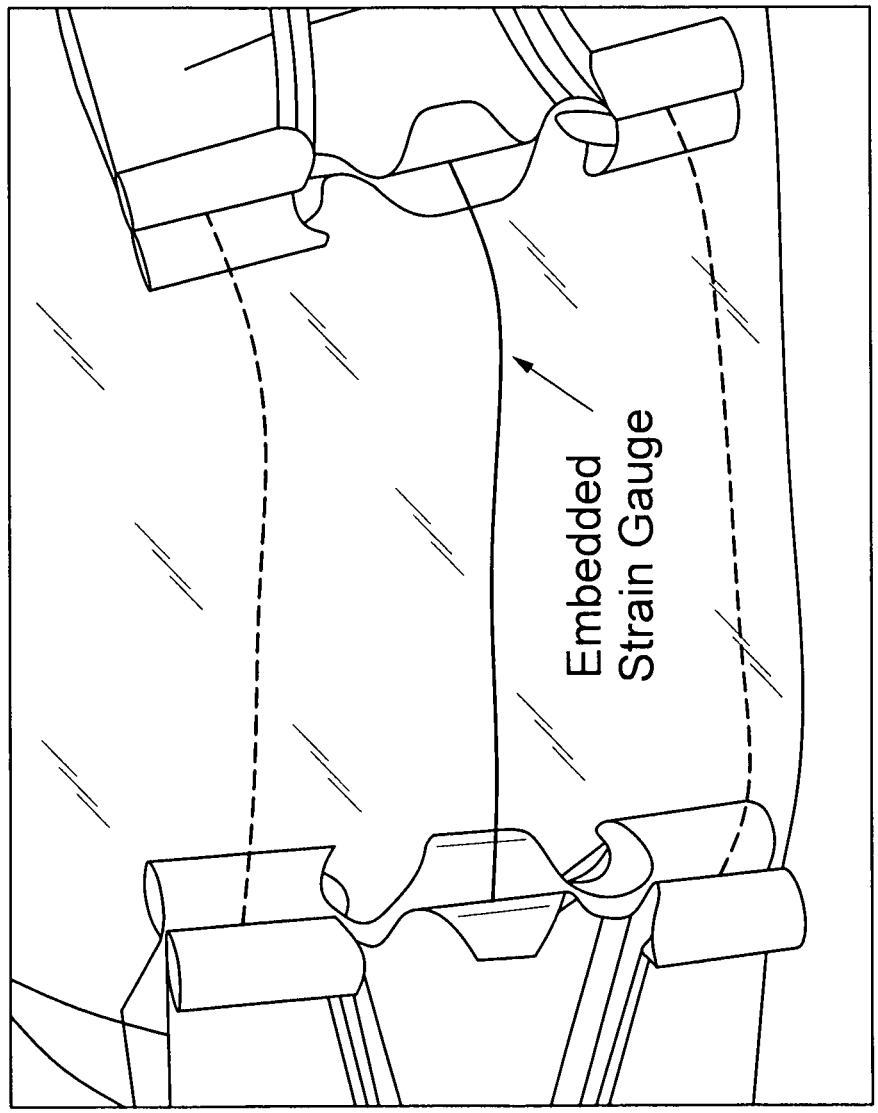
FIG. 4 is a photograph of a PDMS sheet with an embedded strain gauge, according to an embodiment of the present invention.
Figure 5:
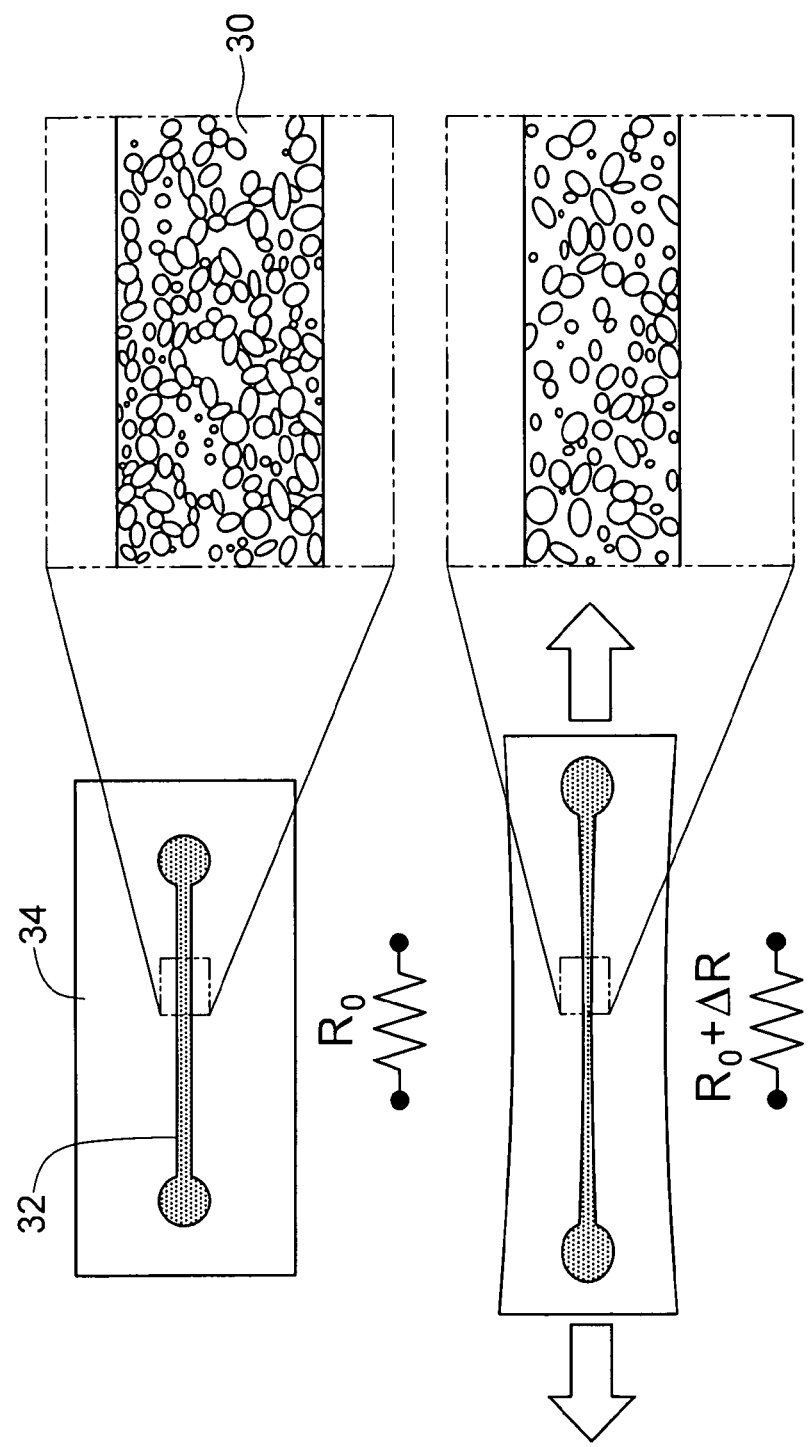
FIG. 5 is a schematic view of the PDMS sheet of FIG. 4.
Figure 6:
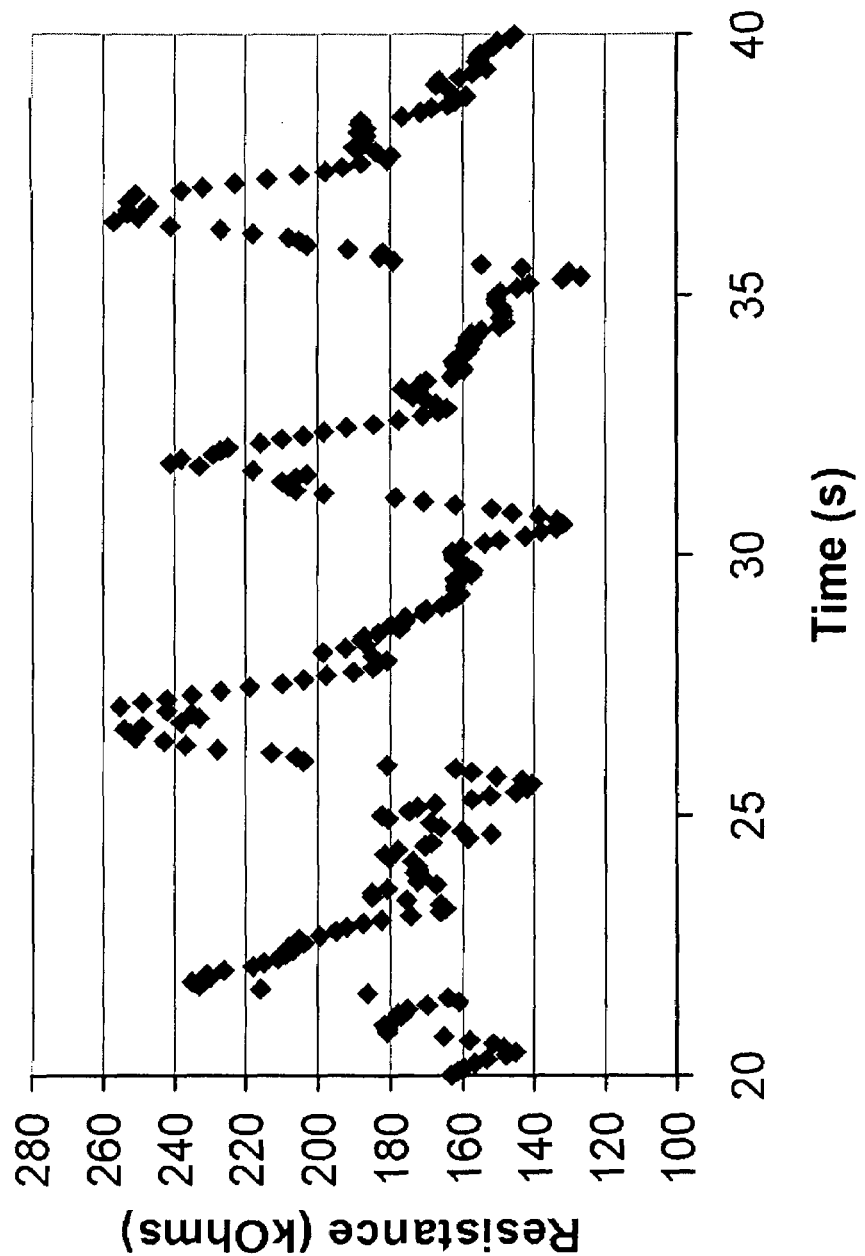
FIG. 6 is a graph showing sample data for a multiwall carbon nanotubes (MWNT) strain gauge undergoing large (~25%) strain.

Other nonlimiting examples of devices include elastomer strain gauges. FIG. 4 shows a sheet of unmodified clear PDMS with an embedded strain gauge of conductive PDMS. The strain gauge extends generally along the length of the unmodified PDMS sheet, shown in perimeter by dashed white lines. In an example operation of the strain gauge, shown in FIG. 5, applied strain alters the average spacing between conductive particles 30 in conductive PDMS 32 within unmodified clear PDMS 34 and therefore alters a resistance reading. Thus, the strain is transduced as a change in resistance. In general, tensile strain causes increased resistance, while compressive strain decreases mean particle spacing and decreases resistance. In contrast to existing semiconductor and metal strain gauges, the exemplary all-elastomer strain gauge shown in FIG. 4 can repeatably measure large strains (e.g., >1%). Embedded in the insulating elastomer, the strain gauge undergoes the same strain as the bulk PDMS, surviving large deformations typical of elastomers. FIG. 6 shows sample data collected with an Agilent 34401A multimeter from an elastomer strain gauge such as that shown in FIG. 4 undergoing large (~25%) strain while being manually stretched.

Figure 7:
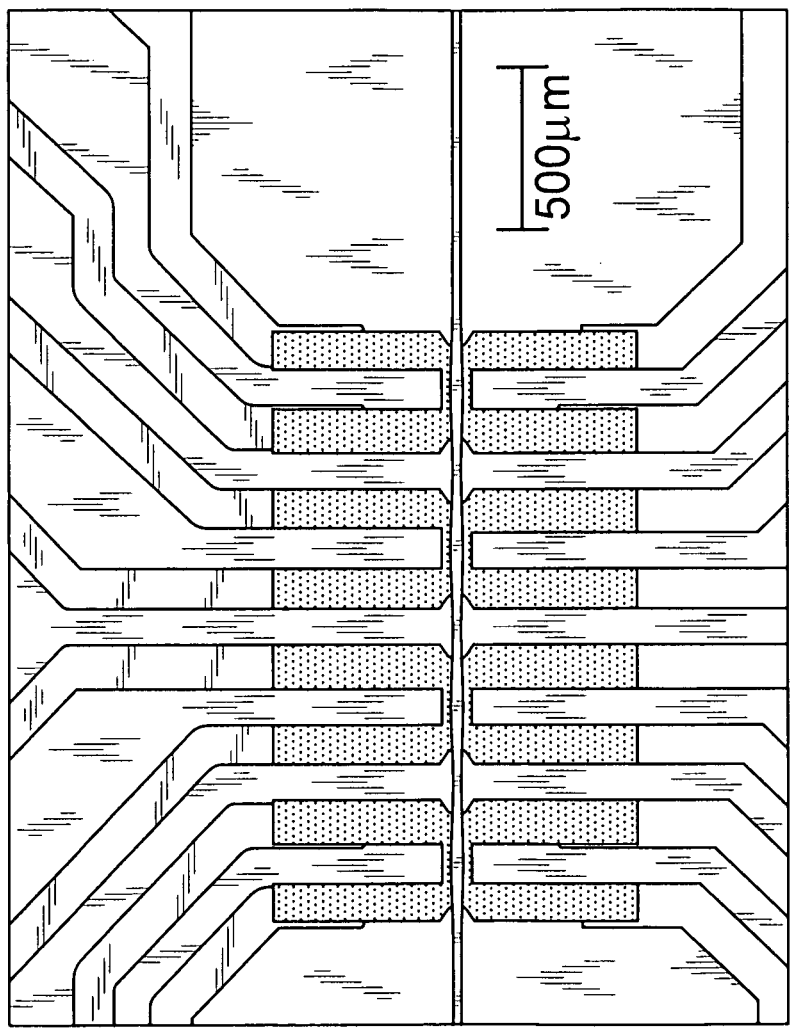
FIG. 7 is a micrograph of embedded flow sensors in a microfluidic channel filled with dye, according to an embodiment of the present invention.

Another example device using conductive and nonconductive PDMS, shown in FIG. 7, includes a nonconductive PDMS sheet having embedded conductive flow sensors. Conventionally, a rigid substrate is needed to bring heaters or sensors into close proximity to microfluidic channels and reaction chambers. Compliant total analysis systems such as required for implantation or use with wearable labs cannot be easily implemented in this way. To overcome these limitations, the device shown in FIG. 7 embeds conductive elastomer sensors along with microfluidic channels to allow detection of liquids, flow, organic solvents, as well as localized heating.

In the device shown in FIG. 7, which may be capable of one or several functions, an embedded sensor array (shown in dotted shading in FIG. 7) formed of conductive PDMS is disposed along a microfluidic channel (shown as a horizontal line) formed from nonconductive PDMS. The conductive portion serves as both a heater and a sensor.

Figure 8:
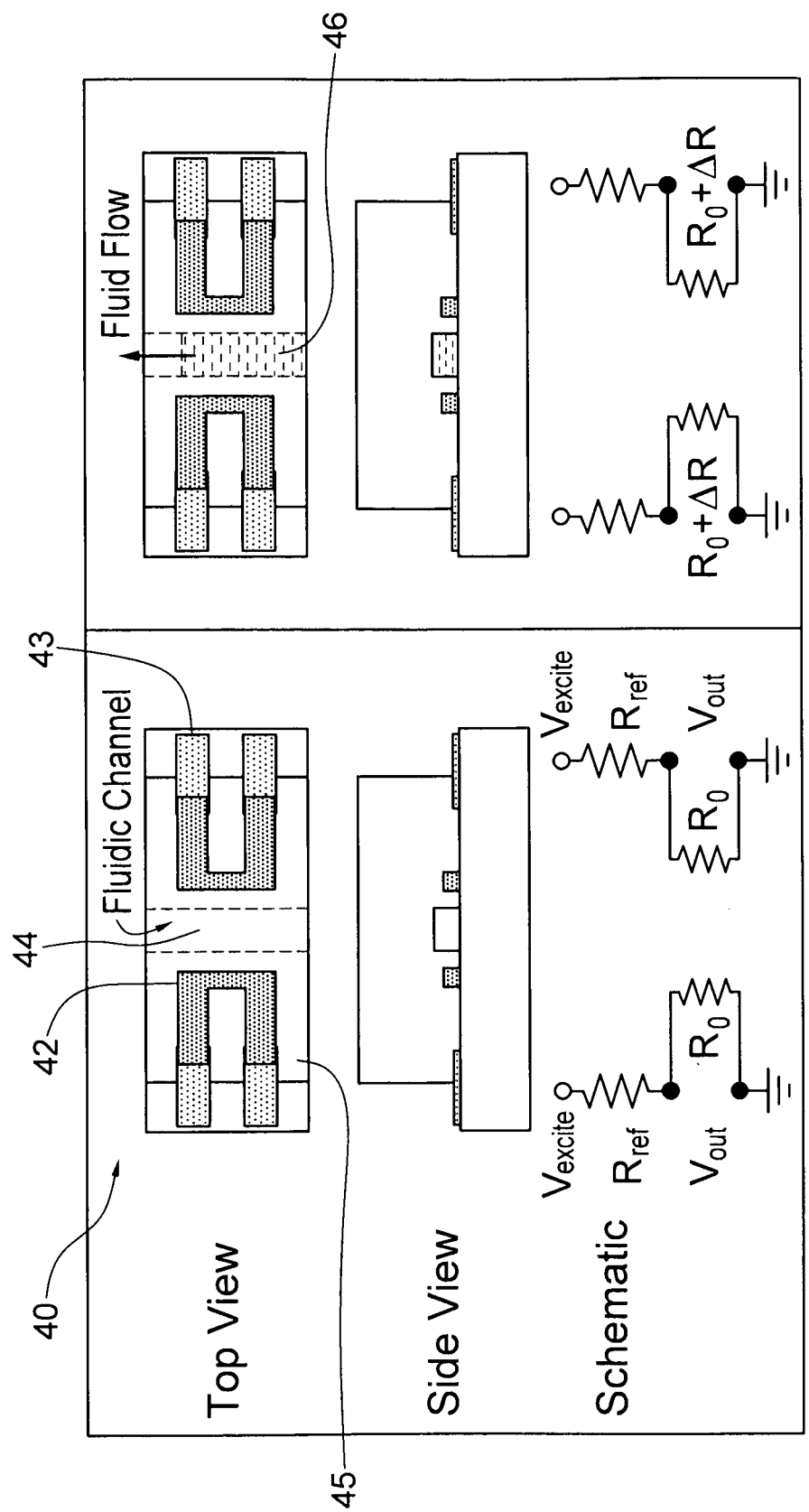
FIG. 8 is a schematic view of an embedded flow sensor as shown in FIG. 7, in which an external reference resistor $R_{ref}$ is connected in series with a PDMS sensor Ro and a current heats the sensor above ambient.
Figure 9:
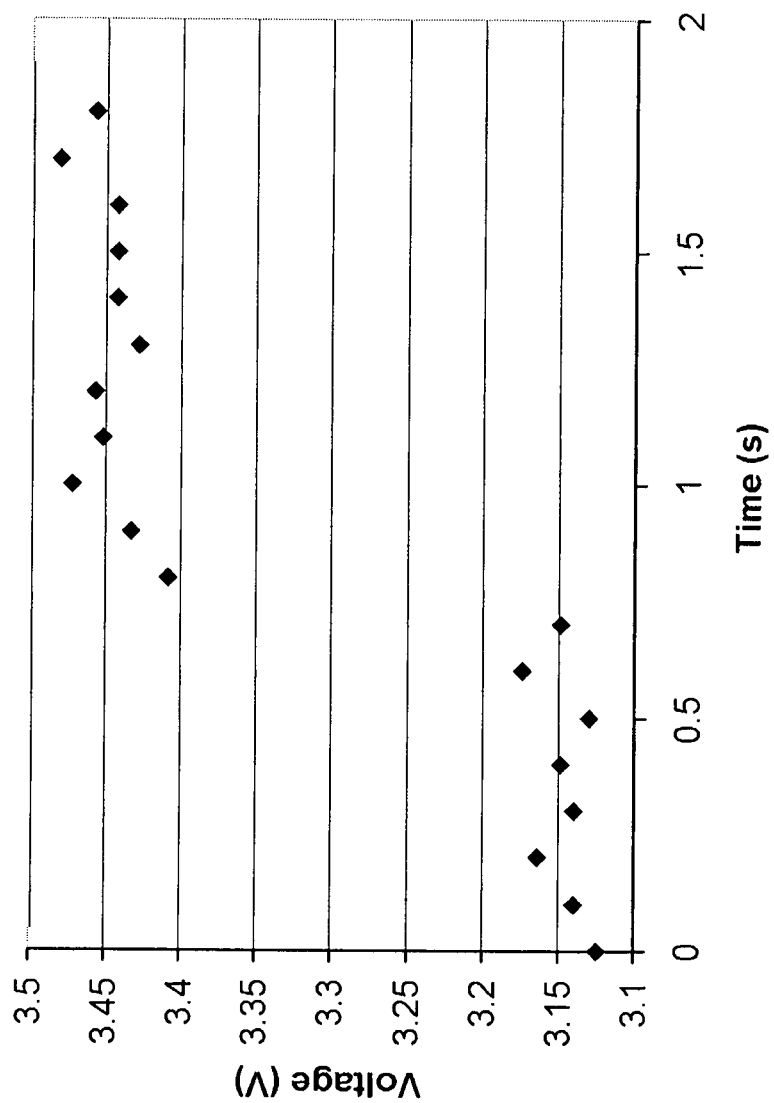
FIG. 9 is a graph showing change in output voltage (6V excitation) when fluid flows into the channel shown in FIGS. 7-8.

The exemplary operating principle generally is that of a heated flow meter 40, as schematically represented in FIG. 8. The flow meter 40 includes a plurality of sensors 42 formed of conductive PDMS (with connectors 43) generally surrounding a fluidic channel 44 formed from nonconductive PDMS within a substrate 45. When the sensor 42 is heated above ambient and the resistance monitored, a change in output signifies a change in heat lost to the environment. With an excitation voltage of 6V, and only 1 µW input power, a large (e.g., ~10%) change in output voltage is measured when a fluid such as water 46 is introduced into the channel 44 (FIG. 9). This change is due to heat loss to the fluid 46. Measurements are made using an Agilent 34401A multimeter. This exemplary sensor 40 can be used to detect fluid fronts or analyte plugs as commonly used in micro total analysis systems.

Figure 10:
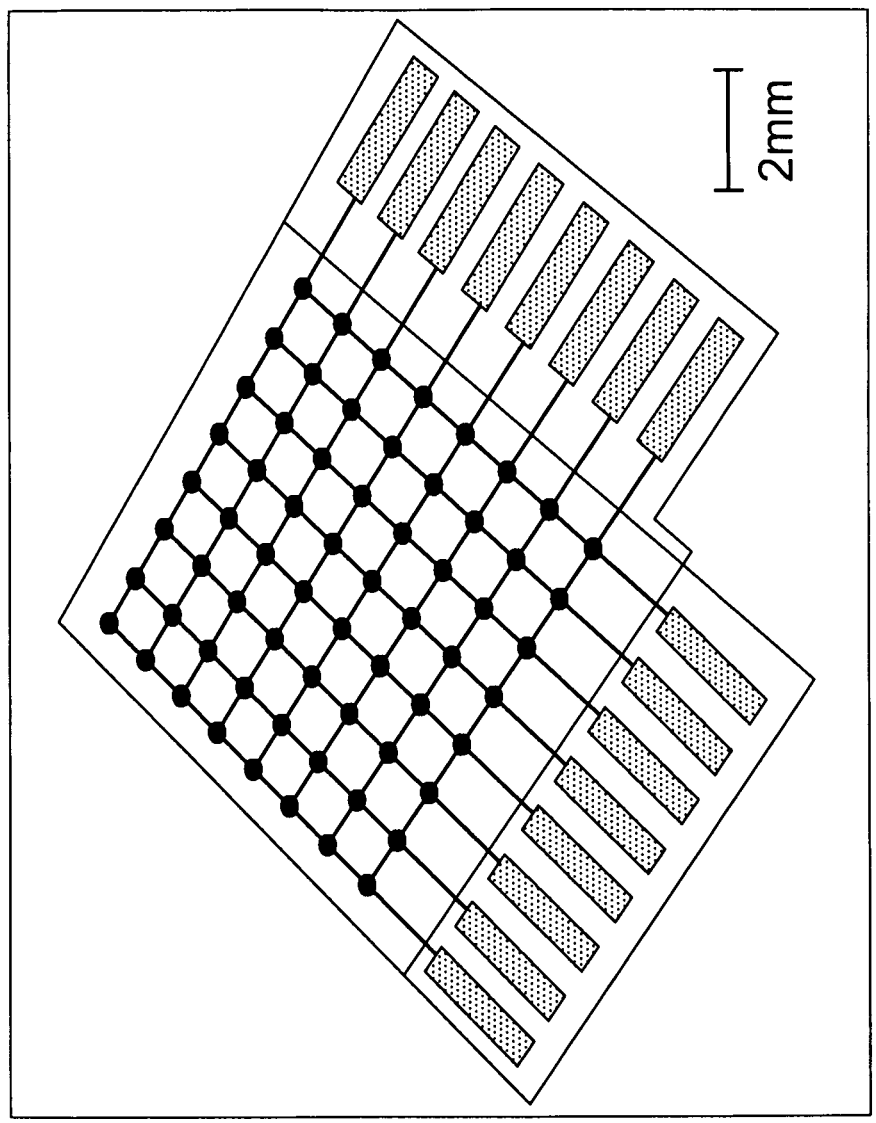
FIG. 10 is a photograph of orthogonal embedded PDMS electrode layers forming an array of capacitive pressure sensors, according to an embodiment of the present invention.
Figure 11:
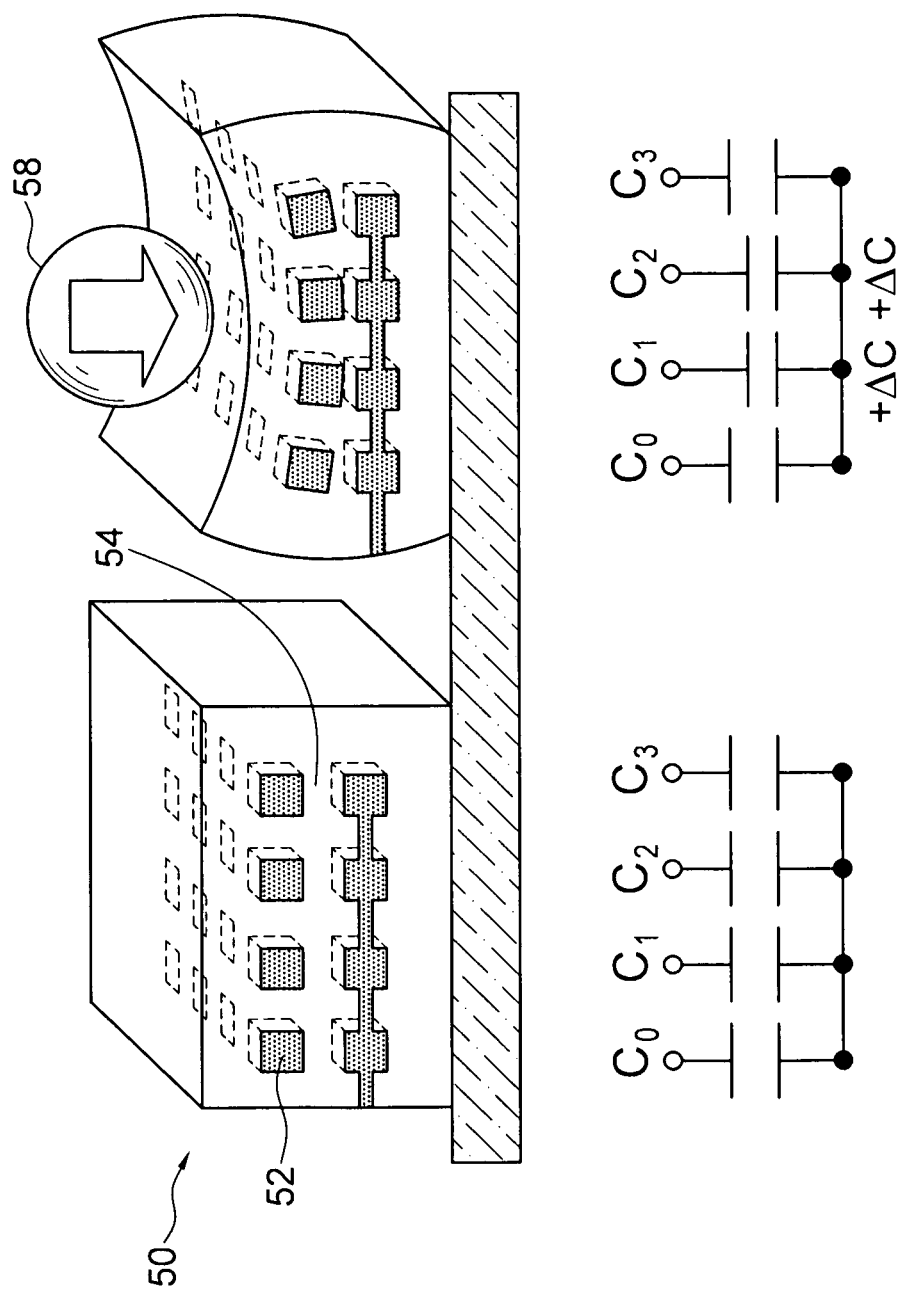
FIG. 11 is a schematic view of the capacitive device of FIG. 10.

By using multiple layers, devices that are more complex may also be provided. For example, by combining two layers of elastomer with embedded electrodes, such as in the tactile sensor sheet shown in FIG. 2, and orienting them orthogonal to each other, a collapsible capacitive polymer device 50 having a matrix of capacitive pressure sensors 52 can be created, an example of which is shown in FIGS. 10-11. The capacitance of a flat plate capacitor is proportional to electrode area and inversely proportional to electrode gap. Thus, large area and small gaps are desired, but using soft materials like PDMS presents a significant challenge for maintaining a small electrode gap. Previous efforts to make collapsible capacitive PDMS devices required larger gaps, numerous bonding steps, and subsequently a large area.

The exemplary collapsible capacitive polymer device 50 uses a PDMS-filled capacitive gap 54 of 4 µm, which gives it high stiffness compared to air-gap capacitive devices. However, the filled gap 54 gives increased robustness to stiction, particles, and mechanical overload, as well as increasing the baseline capacitance of the sensors. Air gap capacitors are possible using similar techniques to those used to create the microfluidic channels shown in FIG. 7.

Figure 12:
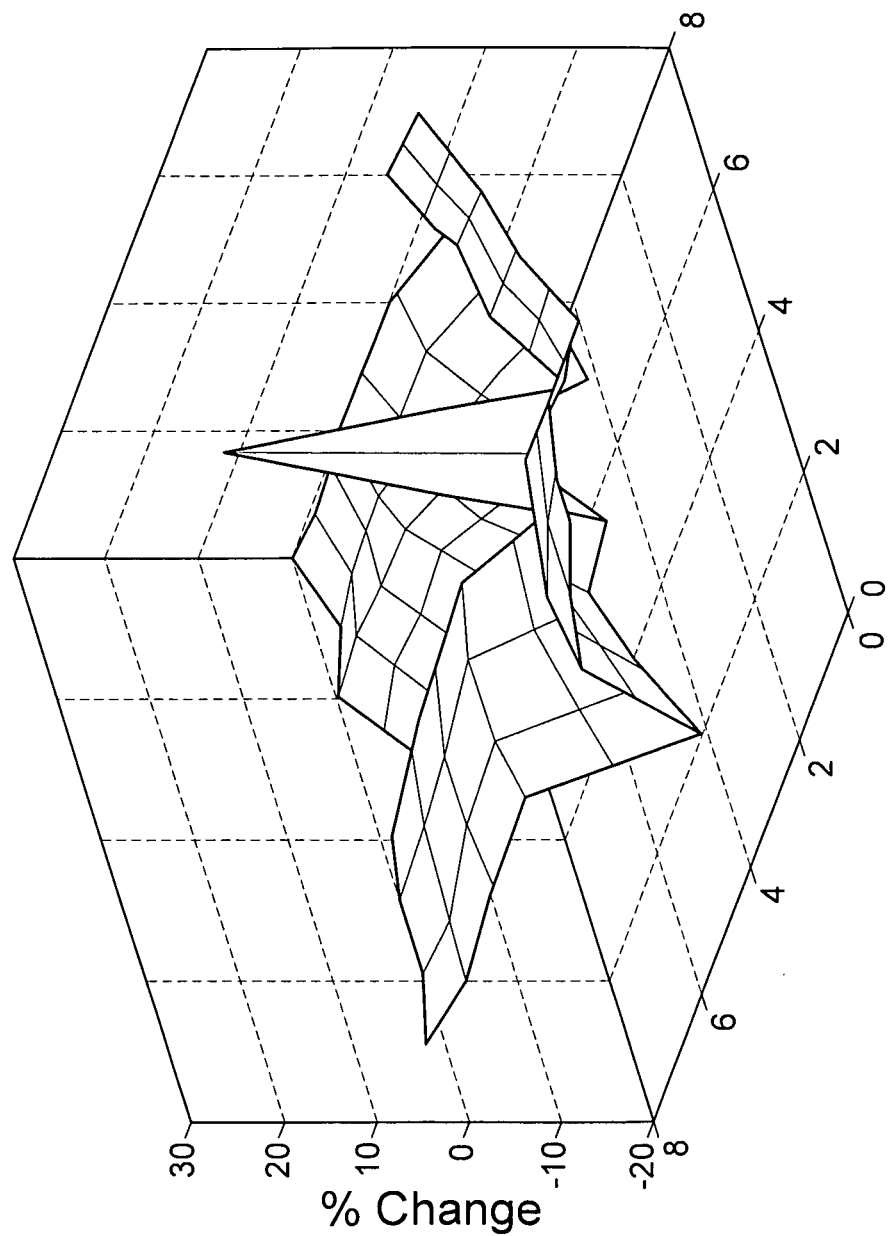
FIG. 12 is a graph showing change in capacitance for the array shown in FIGS. 10-11 when loaded by a 3 mm spherical indenter, where X and Y axes are the row and columns of the capacitive array.

Testing reveals that interrogating the row and column capacitance of the array of sensors 52 allows imaging of contact with other objects. For example, when loaded by a 3 mm spherical indenter 58 under a 500 g load, and the capacitance measured with an Agilent 4263B LCR meter, the array 52 changes capacitance, as shown in FIG. 12. Additionally, the negative-valued artifacts observed in FIG. 12 can be eliminated by, for example, using electronics designed to interrogate multiplexed capacitive arrays. These circuits switch non-interrogated rows and columns to ground to minimize parasitic parallel capacitance.

Thus, exemplary fabrication techniques according to embodiments of the present invention allow realization of all-elastomer MEMS devices (soft MEMS). In some example embodiments, this is accomplished by combining micropatterning of modified (e.g., conductive) elastomer features with traditional spin casting and molding of nonmodified (e.g., insulating) elastomers. Conductive elastomers are made functional by methods including, but not limited to, mixing with multi-walled carbon nanotubes. In this way, example embodiments of the present invention can provide various new devices, including but not limited to all-elastomer strain gauges, microfluidic systems with embedded elastomer sensors and heaters, and robust stretchable capacitive elastomer tactile sensors. Other applications of exemplary fabrication techniques include soft biomedical applications, such as interocular pressure measurements, large strain measurements for smart-prosthetics and robotics, and compliant pathogen detection systems for wearable deployment.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. A microscale polymer-based apparatus comprising:
   a continuous insulating substrate formed from a first polymer material;
   at least one active region fixed in and surrounded by said substrate, said at least one active region being patterned from a second polymer material that is separate from said first polymer material;
   wherein the second polymer material is modified with a metal powder or multi-walled carbon nanotubes (MWNT) to be conductive and perform at least one function within said at least one active region;

wherein each of said at least one active region is shaped and disposed to provide a polymer island within said insulating substrate such that said substrate encapsulates at least three sides of the polymer island, wherein the at least three sides define a seam between the polymer island and said insulating substrate.

2. The apparatus of claim 1, wherein the second polymer material comprises a composite polymer material including the first polymer material and at least one additive.

3. The apparatus of claim 1, wherein said at least one active region comprises a plurality of active regions embedded in said insulating substrate;
wherein said plurality of active regions are separated from one another by respective portions of said insulating substrate.

4. The apparatus of claim 3, wherein said plurality of active regions are encapsulated by respective portions of said insulating substrate.

5. The apparatus of claim 1, wherein said at least one active region comprises at least one of a polymer electrode, an embedded polymer strain gauge, a polymer conductive sensor, and a polymer heater.

6. The apparatus of claim 1, wherein said substrate comprises a non-conductive sheet, and wherein said at least one active region comprises at least one embedded polymer strain gauge.

7. The apparatus of claim 1, wherein said substrate includes a microfluidic channel formed therein, and wherein said at least one active region comprises at least one embedded conductive polymer flow rate sensor.

8. The apparatus of claim 1, wherein said substrate includes a microfluidic channel formed therein, and wherein said at least one active region comprises at least one polymer resistive heater.

9. The apparatus of claim 1, wherein said substrate includes a plurality of nonconductive layers, and wherein said at least one active region comprises a plurality of active regions, each of said plurality of nonconductive layers including a plurality of active regions.

10. The apparatus of claim 1, wherein said substrate includes a plurality of nonconductive layers;
wherein said at least one active region comprises a plurality of embedded electrodes, each of said plurality of nonconductive layers including a plurality of embedded electrodes;
wherein the embedded electrodes are arranged with respect to adjacent nonconductive layers to provide a capacitive array.

11. The apparatus of claim 1, wherein said insulating substrate comprise a flexible, nonconductive skin, wherein said at least one active region comprises a plurality of active regions embedded within said insulating skin such that each of the plurality of active regions are separated from one another by a portion of said insulating skin.

12. The apparatus of claim 1, further comprising:
at least one electrical contact electrically coupled to said at least one active region.

13. The apparatus of claim 1, wherein the first polymer material comprises an elastomer, and wherein the second polymer material comprises an elastomer modified to become conductive.

14. The apparatus of claim 13, wherein the first polymer material comprises polydimethylsiloxane (PDMS), and wherein the second polymer material comprises PDMS modified to become conductive.

15. The apparatus of claim 14, wherein the second polymer material comprises PDMS combined with multiwall carbon nanotubes (MWNT).

16. A method of forming a microscale polymer-based device, the method comprising:
patterning a photoresist on a substrate to provide a photoresist mold;
applying a modified polymer to the photoresist mold to form at least one modified polymer structure, wherein the modified polymer is modified with a metal powder or multi-walled carbon nanotubes (MWNT);
removing said patterned photoresist;
forming nonmodified polymer around the at least one modified polymer structure to provide a continuous nonmodified polymer structure having a surface and capture the at least one modified polymer structure within the nonmodified polymer structure along the surface, wherein the nonmodified polymer structure contacts the at least one modified polymer structure and directly surrounds the at least one modified polymer structure along the surface, wherein the modified polymer structure is shaped and disposed to provide a polymer island within the nonmodified polymer structure such that the nonmodified polymer structure encapsulates at least three sides of the polymer island, wherein the at least three sides define a seam between the modified polymer structure and the nonmodified polymer structure; and
releasing the at least one modified polymer structure and the nonmodified polymer structure from the substrate.

17. The method of claim 16 wherein the modified polymer comprises the nonmodified polymer and an additive to make the modified polymer conductive.

18. The method of claim 17, wherein the nonmodified polymer comprises polydimethylsiloxane (PDMS), and wherein the modified polymer comprises PDMS combined with multiwall carbon nanotubes (MWNT).

19. The method of claim 16, wherein the at least one modified polymer structure comprises at least one of an electrode, a flow sensor, a heater, strain gauge, a capacitor plate, a chemical sensor, or a biosensor.

20. A microscale polymer-based apparatus comprising:
a continuous insulating substrate formed from a first elastomeric material, said insulating substrate defining a planar surface;
at least one conductive active region embedded in said insulating substrate such that said insulating substrate contacts said at least one active region and directly surrounds said at least one active region along the planar surface, said at least one active region being patterned from a second elastomeric material that is separate from said first elastomeric material, wherein each of said at least one conductive active region is shaped and disposed to provide a polymer island within said continuous insulating substrate such that said continuous insulating substrate encapsulates at least three sides of the polymer island, wherein the at least three sides define a seam between the polymer island and said insulating substrate;
wherein the second elastomeric material is modified with a metal powder or multi-walled carbon nanotubes (MWNT) to be conductive and perform at least one function within each of said at least one active region.

21. The apparatus of claim 20, wherein said insulating substrate comprises a continuous portion completely surrounding said at least one active region along the planar surface.

22. The apparatus of claim 1, wherein said at least one active region is embedded in said substrate such that said substrate completely encapsulates each of said at least one active region, respectively.

23. The apparatus of claim 1, wherein said substrate directly contacts and encapsulates said at least one active region.

24. The apparatus of claim 1, wherein the active region is formed entirely of the second polymer material.

25. The apparatus of claim 24, wherein the apparatus is made entirely of polymer material.

* * * * *

UNITED STATES PATENT AND TRADEMARK OFFICE
CERTIFICATE OF CORRECTION

PATENT NO. : 8,431,080 B2  
APPLICATION NO. : 11/809757  
DATED : April 30, 2013  
INVENTOR(S) : Chang Liu et al.

It is certified that error appears in the above-identified patent and that said Letters Patent is hereby corrected as shown below:

In the Specification:

Col. 2, line 14    After "PDMS sensor" delete "Ro" and insert --$R_0$-- therefor.

Signed and Sealed this  
Thirteenth Day of August, 2013

Teresa Stanek Rea  
*Acting Director of the United States Patent and Trademark Office*